US008638144B1

(12) United States Patent
Shyu et al.

(10) Patent No.: US 8,638,144 B1
(45) Date of Patent: Jan. 28, 2014

(54) SYSTEMS AND METHODS INVOLVING PHASE DETECTION WITH ADAPTIVE LOCKING/DETECTION FEATURES

(75) Inventors: Jyn-Bang Shyu, Cupertino, CA (US); Yoshinori Sato, San Jose, CA (US); Jae Hyeong Kim, San Ramon, CA (US); Lee-Lean Shu, Los Altos, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 134 days.

(21) Appl. No.: 12/982,839

(22) Filed: Dec. 30, 2010

Related U.S. Application Data

(60) Provisional application No. 61/291,319, filed on Dec. 30, 2009.

(51) Int. Cl.
*H03L 7/06* (2006.01)

(52) U.S. Cl.
USPC ............................................. 327/158; 327/12

(58) Field of Classification Search
None
See application file for complete search history.

(56) References Cited

U.S. PATENT DOCUMENTS

| | | | |
|---|---|---|---|
| 5,646,519 A | 7/1997 | Hamilton et al. | |
| 5,811,998 A | 9/1998 | Lundberg et al. | |
| 6,087,868 A | 7/2000 | Millar | |
| 6,140,852 A | 10/2000 | Fischer et al. | |
| 6,242,955 B1 * | 6/2001 | Shen et al. | 327/158 |
| 6,313,707 B1 | 11/2001 | Fischer et al. | |
| 6,337,590 B1 | 1/2002 | Millar | |
| 6,590,426 B2 | 7/2003 | Perrott | |
| 6,618,283 B2 | 9/2003 | Lin | |
| 6,759,882 B2 | 7/2004 | Lin | |
| 6,791,381 B2 | 9/2004 | Stubbs et al. | |
| 6,809,555 B1 | 10/2004 | Nguyen | |
| 6,812,753 B2 | 11/2004 | Lin | |
| 6,826,247 B1 | 11/2004 | Elliot et al. | |
| 7,010,014 B1 | 3/2006 | Percey et al. | |
| 7,034,590 B2 | 4/2006 | Shin | |
| 7,085,544 B2 | 8/2006 | Takano et al. | |
| 7,161,391 B2 | 1/2007 | Lin | |
| 7,187,742 B1 | 3/2007 | Logue et al. | |
| 7,190,200 B2 | 3/2007 | Byun | |
| 7,215,209 B2 | 5/2007 | Park | |
| 7,230,997 B2 | 6/2007 | Kurakami et al. | |
| 7,236,028 B1 | 6/2007 | Choi | |
| 7,324,787 B2 | 1/2008 | Kurakami et al. | |
| 7,336,752 B2 * | 2/2008 | Vlasenko et al. | 375/376 |
| 7,372,341 B2 | 5/2008 | Nagarakanti et al. | |
| 2006/0119396 A1 | 6/2006 | Lim | |
| 2006/0139076 A1 | 6/2006 | Park | |
| 2006/0267636 A1 | 11/2006 | Lin | |

(Continued)

OTHER PUBLICATIONS

Dehng, G. et al., "Clock-Dskew Buffer Using a SAR-Controlled Delay-Locked Loop", IEEE Journal of Solid-State Circuits, vol. 35, No. 8, Aug. 2000, pp. 1128-1136.

(Continued)

*Primary Examiner* — Cassandra Cox
(74) *Attorney, Agent, or Firm* — DLA Piper LLP (US)

(57) ABSTRACT

Systems and methods associated with control of clock signals are disclosed. In one exemplary implementation, there is provided a delay-lock-loop (DLL) and/or a delay/phase detection circuit. Moreover, such circuit may comprise digital phase detection circuitry, digital delay control circuitry, analog phase detection circuitry, and analog delay control circuitry. Implementations may include configurations that prevent transition back to the unlocked state due to jitter or noise.

65 Claims, 10 Drawing Sheets

(56) References Cited

U.S. PATENT DOCUMENTS

2008/0130816 A1 6/2008 Martin et al.
2008/0265957 A1 10/2008 Luong et al.
2008/0284525 A1 11/2008 Williams
2009/0041104 A1 2/2009 Bogdan
2009/0257542 A1 10/2009 Evans et al.

OTHER PUBLICATIONS

Lin, F. et al., "A Register-Controlled Symmetrical DLL for Double-Data-Rate DRAM", IEEE Journal of Solid-State Circuits, vol. 34, No. 4, Apr. 1999, pp. 565-568.

* cited by examiner

SYSTEMS AND METHODS INVOLVING PHASE DETECTION WITH ADAPTIVE LOCKING/DETECTION FEATURES

CROSS-REFERENCE TO RELATED APPLICATION(S)

This application claims benefit and priority of U.S. provisional application No. 61/291,319, filed Dec. 30, 2009, which is incorporated herein by reference in entirety.

BACKGROUND

1. Field

The present innovations relate to relate to provision, control and/or other aspects of clock signal operation(s).

2. Description of Related Information

Numerous computer and chip applications entail provision of a secondary clock signal that is synchronized to a reference clock. Many systems and techniques associated with Delay-Locked Loop ("DLL") circuits, for example, include clock generators used to synchronize the output clocks with the input reference clock(s) for high-speed applications, such as with synchronous SRAM and DRAM. In general, high-speed digital systems often utilize clock generators with improved tuning or other features to improve performance.

As set forth below, one or more exemplary aspects of the present inventions may overcome such shortcomings and/or otherwise impart innovative aspects by, for example, providing circuitry with improved ability to maintain a locked state of a clock signal despite jitter or noise.

SUMMARY

Systems, methods and circuits consistent with the innovations herein relate to provision, control and/or other aspects of clock signals.

In one exemplary implementation, there is provided a delay-lock-loop (DLL) and/or a delay/phase detection circuit. Moreover, such circuit may comprise digital phase detection circuitry, digital delay control circuitry, analog phase detection circuitry, and analog delay control circuitry. Implementations may include configurations and/or innovations that prevent transition back to the unlocked state due to jitter or noise.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the innovations herein, examples of which are illustrated in the accompanying drawings. The implementations set forth in the following description do not represent all implementations consistent with the claimed invention. Instead, they are merely some examples consistent with certain aspects related to the present innovations. Wherever possible, the same reference numbers will be used throughout the drawings to refer to the same or like parts.

Many systems and techniques associated with Delay-Locked Loop ("DLL") circuits include clock generators used to synchronize the output clocks with the input reference clock(s) for high-speed applications, such as with synchronous SRAM and DRAM. In general, high-speed digital systems often utilize clock generators with improved tuning or other features to improve performance.

Figure 1:
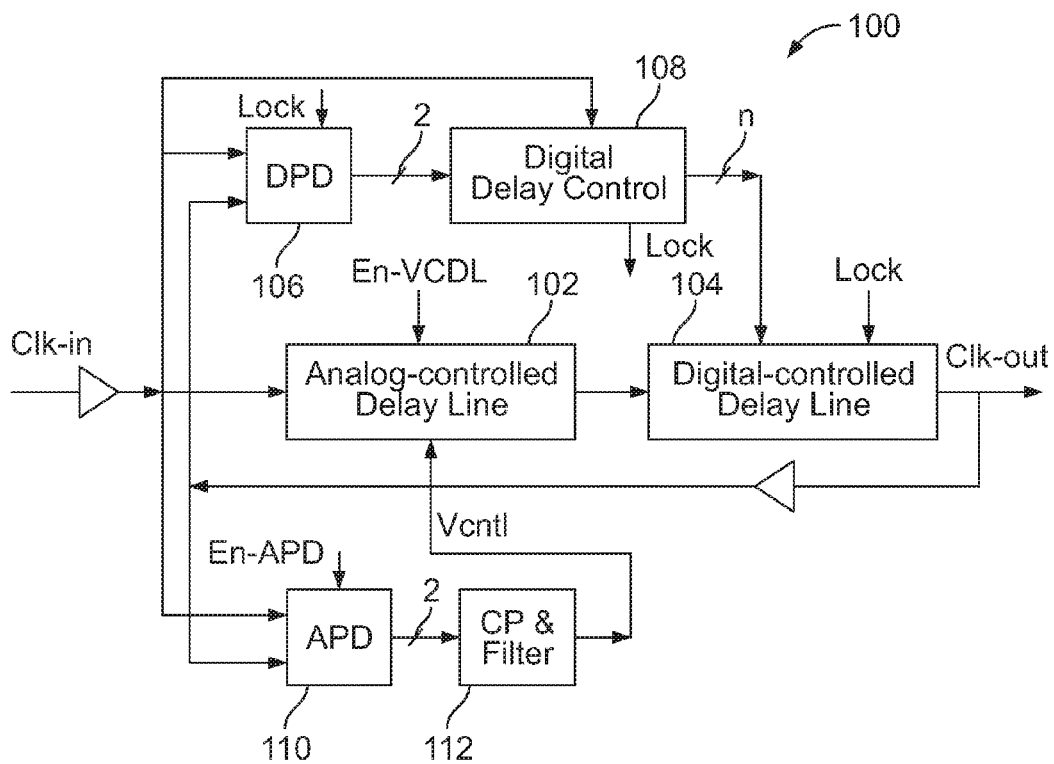
FIG. 1 illustrates a block diagram of an exemplary digital phase detector circuit consistent with certain aspects related to the innovations herein.

FIG. 1 illustrates a block diagram of an exemplary Delay-Locked Loop circuit 100 consistent with certain aspects related to the innovations herein. With regard to the representative Delay-Locked Loop circuitry shown, the circuit includes both a digital delay line 102 and an analog delay line 104 to enhance its delay tuning capability. Referring to FIG. 1, the illustrative circuit 100 may further comprise digital phase detector circuitry 106, digital delay control circuitry 108, analog phase detector circuitry 110 as well as other circuitry, such as charge-pump and/or filter circuitry 112 associated with the analog phase detector circuitry 110 or analog-controlled delay line 102. In one implementation, the digital phase detector 106 (DPD) and analog phase detector 110 (APD) are configured to control the digital delay line 104 and the analog delay line 102, respectively.

With regard to operation of such Delay-Locked Loop circuitry, the digital phase detector circuitry 106 may be configured to initially operate while the analog phase detector circuitry 110 waits for its turn at the standby mode. After the digital phase detector 106 achieves the phase-locking condition, i.e., the clock phases of both the input and output clocks are closely aligned in phase, then the analog phase detector circuitry 110 will commence operation to further align the phases of both input and output clocks. The circuitry 110 may then perform additional alignment of the input and output clocks, e.g., in jittery or noisy environments such as simultaneous switching outputs (SSO) in high-speed memory applications. Here, for example, improved jitter performance for the output clock can be achieved by using the mixed-mode DLL 100, which consists of both digital and analog delay loop functions. Conventionally, in order to minimize the phase difference between the input clock and output clock, a narrow, pre-defined timing window for the digital phase detector has been used.

Figure 2:
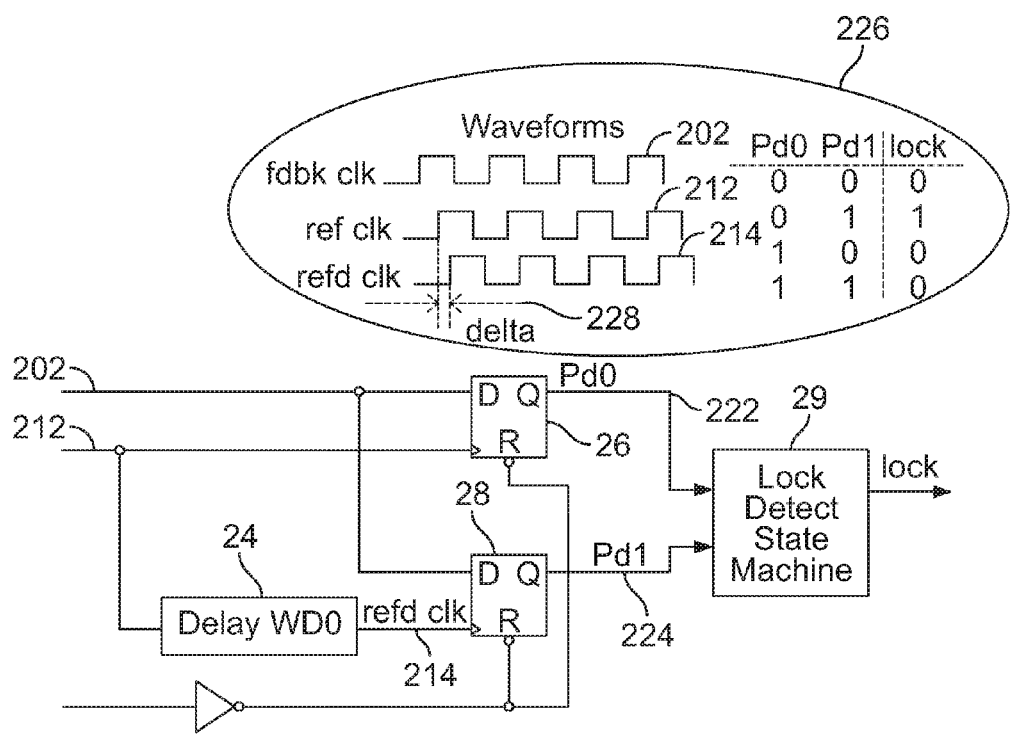
FIG. 2 illustrates a block diagram of a representative digital phase detector circuit known in the art, and related waveforms.

FIG. 2 illustrates a block diagram of an illustrative digital phase detector circuit and associated truth table representative of existing circuits [1, 2]. Referring to the circuit of FIG. 2, an illustrative digital phase detector may comprise a first input line, such as a feedback clock 202, and a second input line, such as a reference clock 212, that are fed into a pair of flip-flops 26, 28 to provide the logic signals for lock detect circuitry 29. Here, for example, the feedback clock 202 and the reference clock 212 may be provided as inputs to the first flip-flop 26 of the pair of flip-flops. Further, the feedback clock 202 and a delayed version of the reference signal (refd_clk) 214 may be provided as inputs to the second flip-flop 28. The delayed reference signal 214 may be provided by transmitting the reference signal through a delay circuit 24. Additionally, then, the first flip-flop 26 provides, as output, a first lock signal 222 for transmission to the lock detect circuitry, and the second flip-flop 28 provides, as output, a second lock signal 224 also for the lock detect circuitry. The interrelationship between the feedback and reference clock signals 202, 212, the two sampled feedback clock signals of Pd0 222 and Pd1 224, and the lock detect circuitry 29 output (i.e. lock) are shown via the summary and truth table 226 of FIG. 2, which indicates how the digital phase detector operates and how the phase-locking condition is achieved. The graph of waveforms in this summary 226 also illustrates an exemplary timing window 228 or delta within which the phase detection operation may occur.

Figure 3:
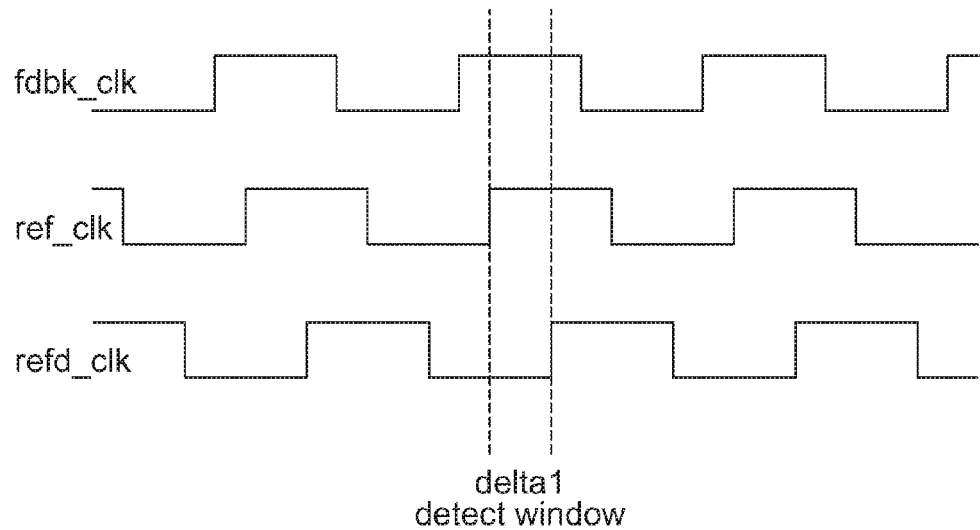
FIGS. 3 and 4 illustrate waveforms associated with representative digital phase detector circuit(s) known in the art.
Figure 4:
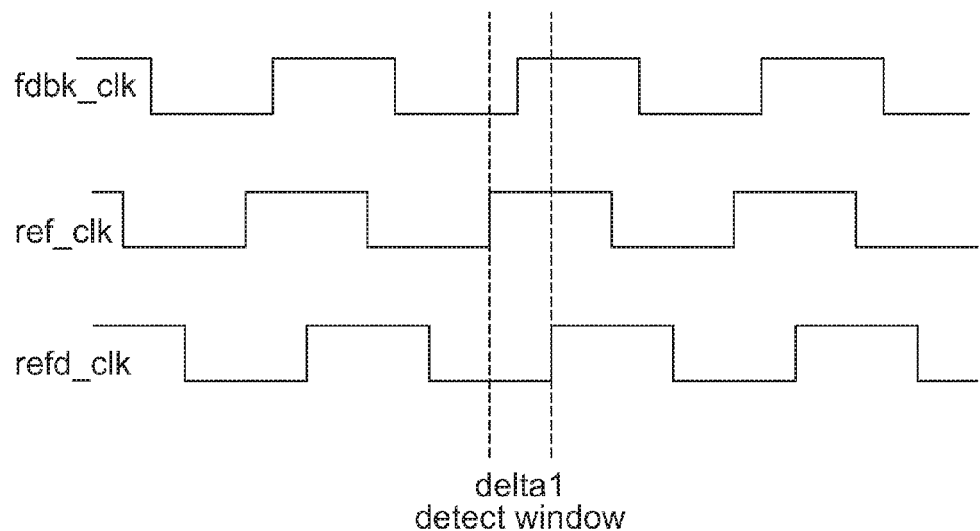

FIGS. 3 and 4 illustrate waveforms associated with representative digital phase detector circuit(s) known in the art. FIG. 3, for example, illustrates waveforms of a DLL in an unlocked condition, wherein the feedback clock is not locked to the reference clock and the rising edge of the feedback clock is characterized as preceding the rising edge of the reference clock. Here, the feedback clock is outside the detect window, thus no lock exists. FIG. 4, illustrates waveforms of a DLL in an locked condition, wherein the rising edge of the feedback clock now falls between the rising edge of the reference clock and the rising edge of the delayed reference clock.

After lock is achieved in Delay-Locked Loop ("DLL") systems including such circuitry, excessive cycle-to-cycle jitters of the output clock, e.g., caused by noisy environments, may force the DLL to be easily unlocked because the phase detect window is small. Once, e.g., a mixed-mode DLL of this nature becomes unlocked, its output clock will have to re-start the locking process with the input reference clock. This re-locking process, in turn, often causes worse jitter performance for the output clock of the DLL.

Figure 5:
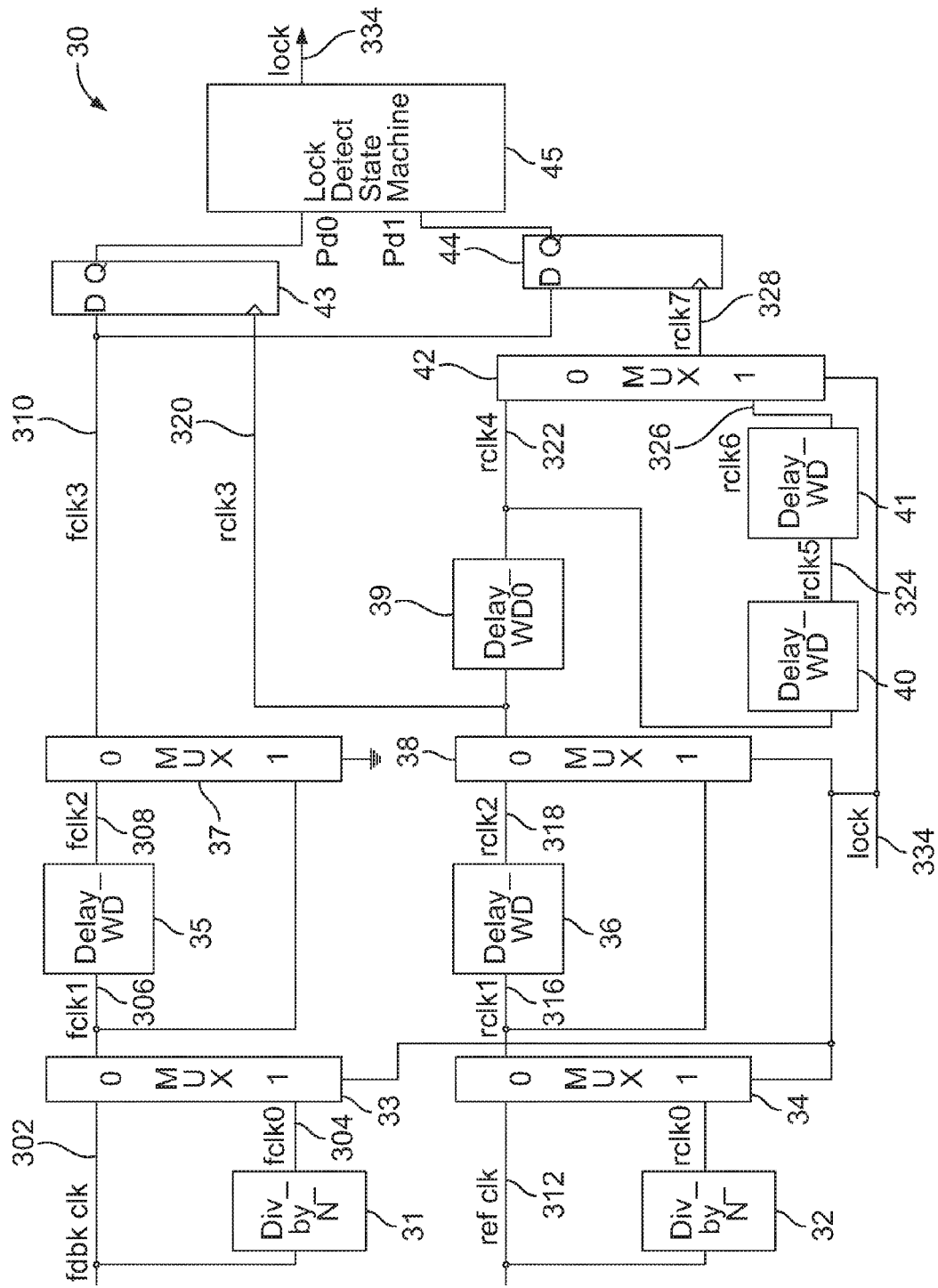
FIG. 5 illustrates a block diagram of an exemplary digital phase detector circuit consistent with certain aspects related to the present invention.

According to some implementations consistent with the innovations herein, for example, the digital phase detection window and/or the phase detection frequency may be adaptive. FIG. 5, for example, illustrates a block diagram of an exemplary digital phase detector circuit consistent with certain aspects related to the present invention. Referring to FIG. 5, exemplary circuit 30 may comprise two divide-by-N clock dividers 31, 32, several multiplexers 33, 34, 37, 38, 42, a variety of delay circuits 35, 36, 39, 40, 41, flip-flops 43, 44, lock detection circuitry 45, and optionally other circuits (not shown). The two main clock inputs of the exemplary digital phase detector 30, shown here, are a feedback clock 302 (fclk) and a reference clock 312 (xclk). In this exemplary implementation, the feedback clock 302 (fclk) is the feedback clock from the digital delay line of the delay-lock-loop circuitry. Referring to FIG. 5, both the feedback clock signal 302 and the reference clock signal 312 are input to respective divide-by-N clock dividers 31, 32. In one exemplary implementation, the dividers 31, 32 may be divide-by-2 dividers (e.g., N=2), as set forth and explained in more detail in connection with FIG. 6. The feedback clock signal 302 may be fed into a divide-by-N clock divider 31, with the output 304 (fclk0) of the divide-by-N clock divider 31 and its respective original clock signal 302 being provided as an input to a first multiplexer 33. (The reference clock signal 312 may be similarly fed into a divide-by-N clock divider 32 and second multiplexer 34, as set forth in more detail below.) The multiplexed feedback signal 306 (fclk1) is then provided as input both to a delay circuit 35 as well as to a third multiplexer 37, with the delayed version of the multiplexed feedback signal 308 (fclk2) being provided as the other input of the multiplexer 37. This third multiplexer output 310 (fclk3) is then provided as input to a first flip-flop 43, which also receives a similarly transformed signal 320 (rclk3) from a fourth multiplexer 38 as a second input. The first flip flop output signal is then provided as a first input of the lock detection circuitry, first lock signal 330 (pd0), with the second lock signal 332 (pd1) thereof being derived via reference clock processing circuitry.

With regard to the reference clock processing circuitry, the reference clock signal 312 may similarly be fed into a divide-by-N clock divider 32, with the output 314 (rclk0) of the divide-by-N clock divider 32 and its respective original reference clock signal 312 being provided as an input to the second multiplexer 34. The multiplexed reference signal 316 (rclk1) is then provided as input both to a delay circuit 36 as well as to a fourth multiplexer 38, with the delayed version of the multiplexed reference signal 318 (rclk2) being provided as the other input of the fourth multiplexer 38. This fourth multiplexer output 320 (rclk3) is then provided as a second input to the first flip-flop 43, as indicated above. Additionally, a delayed fourth multiplexer output signal 322 (rclk4) is provided via a third delay circuit 39 and provided as input to a fifth multiplexer 42. The delayed fourth multiplexer signal 322 is also fed through one or more stages of additional delay circuitry 40, 41 to provide a second signal 326 (rclk6) for input to the fifth multiplexer 42.

The multiplexed output signal 328 (rclk7) of the fifth multiplexer 42 is then provided as an input to a second flip-flop 44 paired with the first flip-flop 43. The third multiplexer output 310 (fclk3) is provided as the other input to the second flip-flop 44, and the output of the second flip-flop 332 (pd1) is provided as the second input to the lock detect circuitry 45.

The difference between the consecutive rising edges of the fourth multiplexer output 320 (rclk3) and the multiplexed output signal 328 (rclk7) forms the phase detection or "delta-timing" window. As set forth in more detail below, when the DLL is unlocked, the delta-timing window will be set to be small. However, when the DLL reaches the lock state, the delta-timing window may be configured to transition to a wide/wider state for the benefit of better noise performance, as described elsewhere herein.

With regard to design and/or selection of the circuits, circuit elements and associated parameters, the phase detect window may be designed to be set small during initial circuit operation (i.e., before the digital phase detector detects a phase-locking condition) to enable achievement of a very tight phase alignment. Additionally, the phase detection frequency may be designed to be set high during initial circuit operation to achieve a very fast phase-locking time.

In one exemplary implementation, the circuitry has a configuration that achieves a very tight phase alignment and a very fast phase locking time during initial operation. After the digital phase detector detects a phase-locking condition, the circuitry may include various adaptive configurations, such as being configured to automatically widen this phase detection window and may also be configured to reduce the phase detection speed to make sure that the DLL will not only remain in the locking condition under any noisy environments but also have a sufficient timing margin via lowering of the phase detection frequency.

Further, as described in the context including the overall Delay-Locked Loop, the clock dividers 31, 32 may be initially disabled to allow full speed operation of the phase detector for increasing the locking time of the DLL. After the DLL achieve a lock condition, the two clock dividers 31, 32 may be enabled. Further, the circuitry may be configured to such that a large phase detection window may then be selected. For example, here, a large/larger phase detection window may be selected via control of the lock signal(s) being applied to multiplexers, such as multiplexers 33, 34, 38 and 42. With a larger phase detection window, then, the analog locking range of the DLL may operate within a wider timing delay range to optimize the jitter performance. A larger phase detection window, however, may entail a very tight timing margin the digital phase detector's phase-sampling process under high-speed operations. Here, the timing margin of the phase-sampling process may be dramatically improved by dividing down the clock frequency of both input and feedback clocks of the digital phase detector.

In one exemplary implementation, the delay of the third delay circuit 39 may be designed such that its' delay is small relative to the delay of the other four delay circuits 35, 36, 40, 41. Moreover, additional examples having adaptive digital phase detection windows and/or adaptive phase detection frequency(ies) are set forth elsewhere herein. Consistent with these adaptiveness features, aspects of the innovations here may improve digital phase detector and/or DLL design to achieve better overall performance.

Figure 6A:
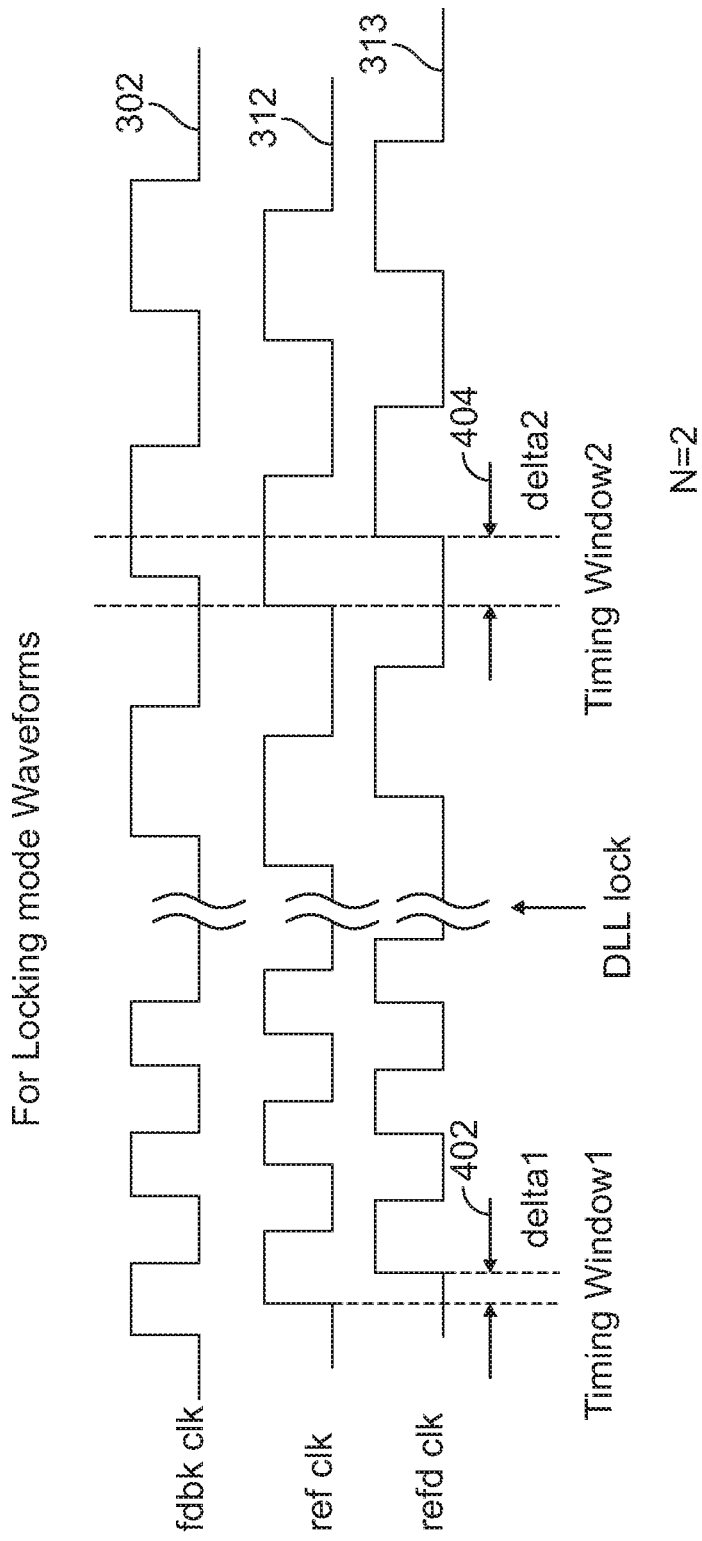
FIG. 6A depicts an illustrative waveform of exemplary digital phase detector circuitry consistent with certain aspects related to the innovations herein.

FIG. 6A depicts an illustrative waveform of an exemplary digital phase detector circuit consistent with certain aspects related to the innovations herein. A feedback clock signal 302, a reference clock signal 312, and a delayed reference clock signal 313 are set forth in the drawing, showing states of the waveforms before and after a phase-locking mode are achieved. Referring to FIG. 6A, a smaller first timing window 402 ("delta1") is shown in connection with the digital phase detector prior to phase lock, and a wider second timing window 404 (delta2) is shown after phase lock. As seen in FIG. 6A, the timing window (difference in rising edges of the reference clock 312 and the reference delay clock 313) may be significantly wider after lock (see delta2 404) as compared to before lock (see delta1 402).

Figure 6B:
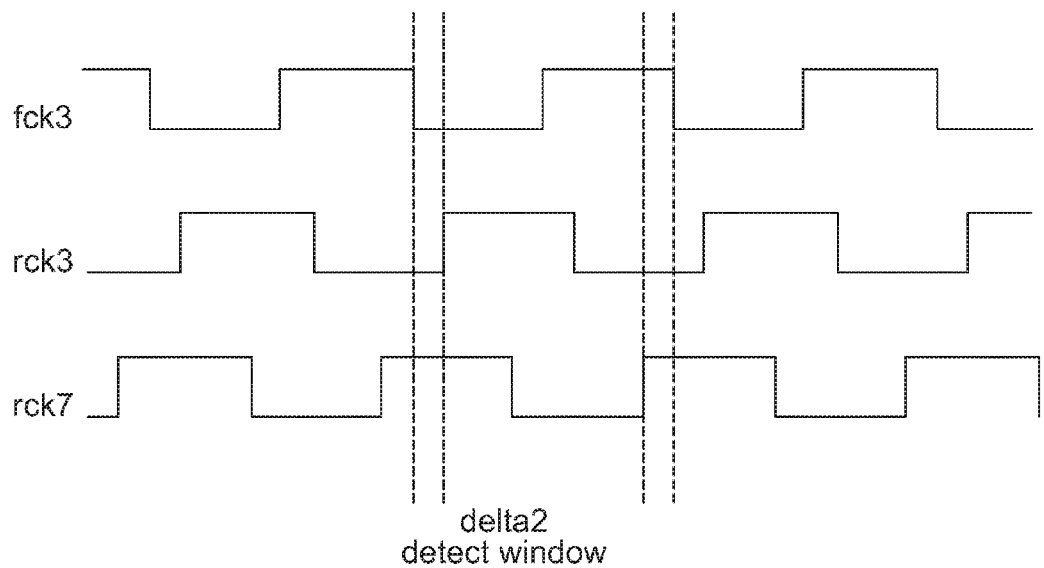
FIGS. 6B and 6C illustrate several illustrative waveforms of an exemplary digital phase detector circuit consistent with certain aspects related to the innovations herein.
Figure 6C:
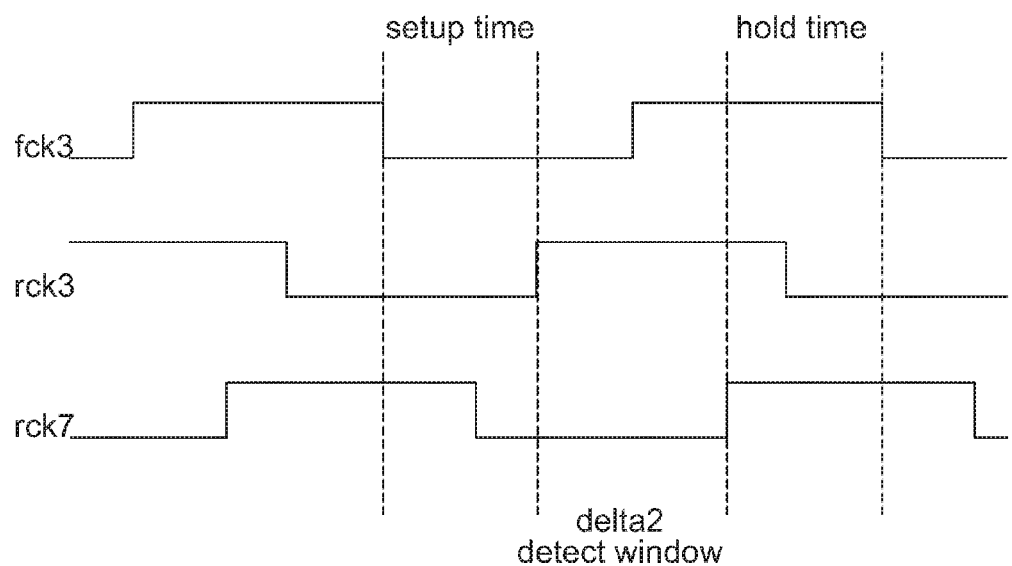

FIGS. 6B and 6C illustrate several illustrative waveforms of an exemplary digital phase detector circuit consistent with certain aspects related to the innovations herein. Referring to FIGS. 6B-6C, setup time/hold time features are shown setting forth how, for example, margin may be adaptively changed from a lock condition with no clock dividing circuits in FIG. 6B to a locked condition with a clock dividing circuit (e.g., divided by 2, in one exemplary implementation) in FIG. 6C, including how a divider may be utilized to assist in enabling the adaptive features, i.e., adjusting (e.g., improving, increasing, etc.) the timing aspects/specifications at high-speed operation. As such, here, once lock occurs (i.e., once the detect window is opened-up), the frequency of the clocks is reduced (e.g., divided-by-2, etc.) to provide a greater effective operating range for maintaining the lock. In other words, an un-lock condition is shown in FIG. 3 and the locked conditions are shown in both FIG. 6B and FIG. 6C. FIG. 6C is consistent with circuits implemented in accordance with features of the innovations herein. For example, according to aspects of the present innovations, the phase detect window may be widened after the DLL is locked. Further, as shown in FIG. 6C, a better setup/hold time margin may be achieved than that of FIG. 6B, via suitable frequency reduction circuitry. For example, a divide-by-N circuit or component, such as the divide-by-2 circuit of FIG. 6C, may be used to divide down the clock. Here, then, such frequency reduction may be achieved under the control of a lock signal to provide a wider timing margin.

Figure 7:
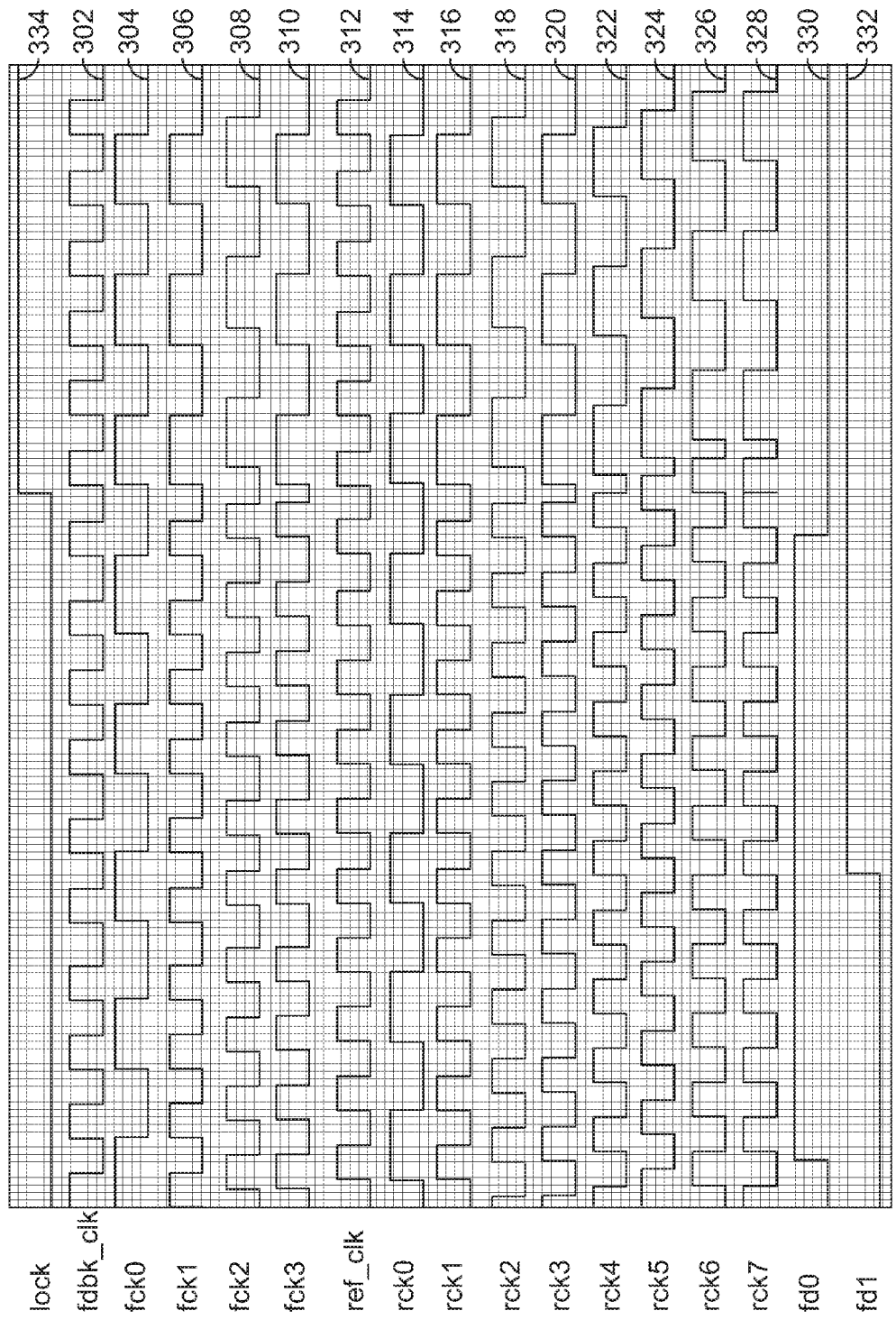
FIG. 7 illustrates a series of illustrative, interrelated waveforms of some exemplary digital phase detector circuits consistent with certain aspects related to the innovations herein.
Figure 8A:
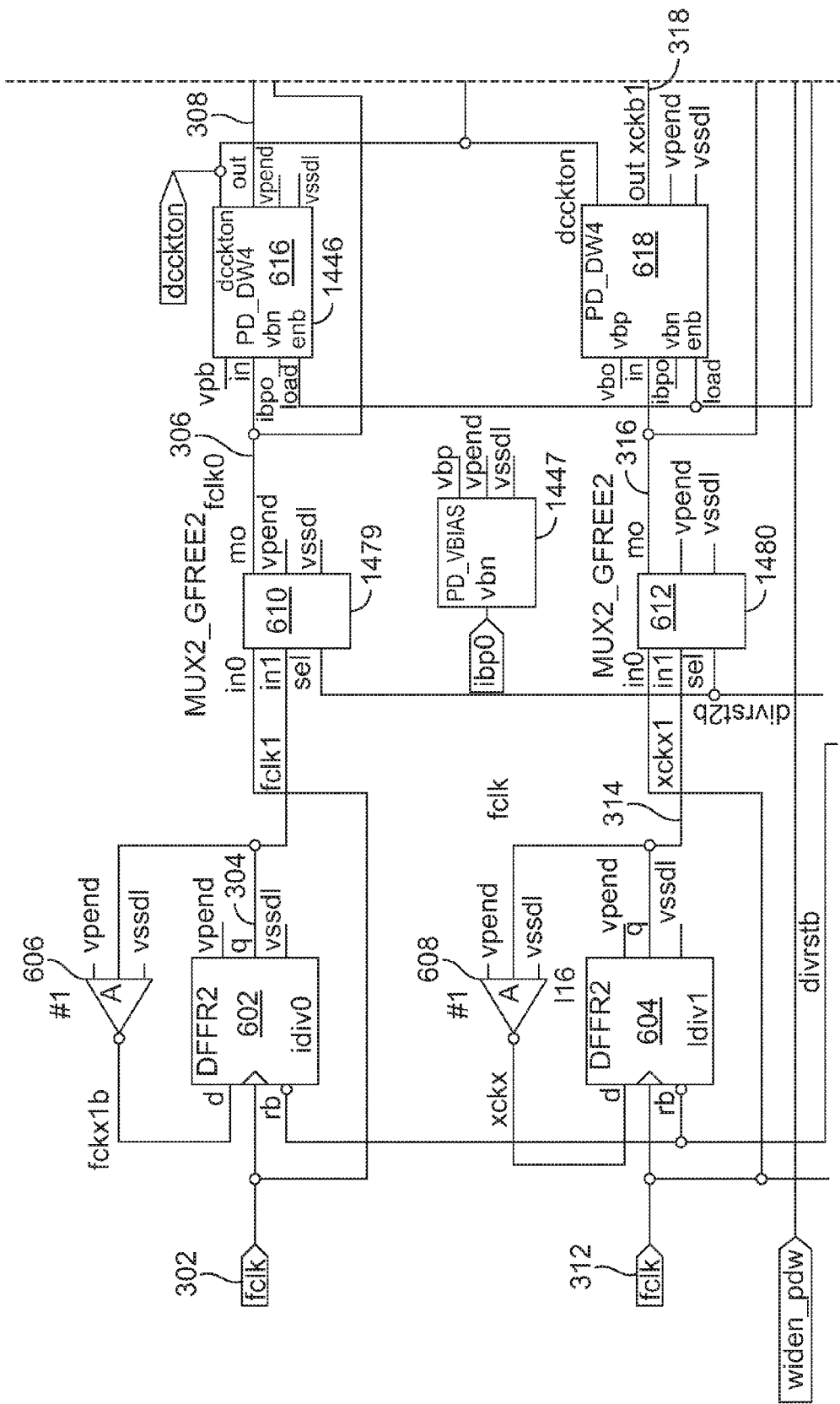
FIGS. 8A-8D illustrate a block diagram of an exemplary digital phase detector circuit consistent with certain aspects related to the innovations herein.
Figure 8B:
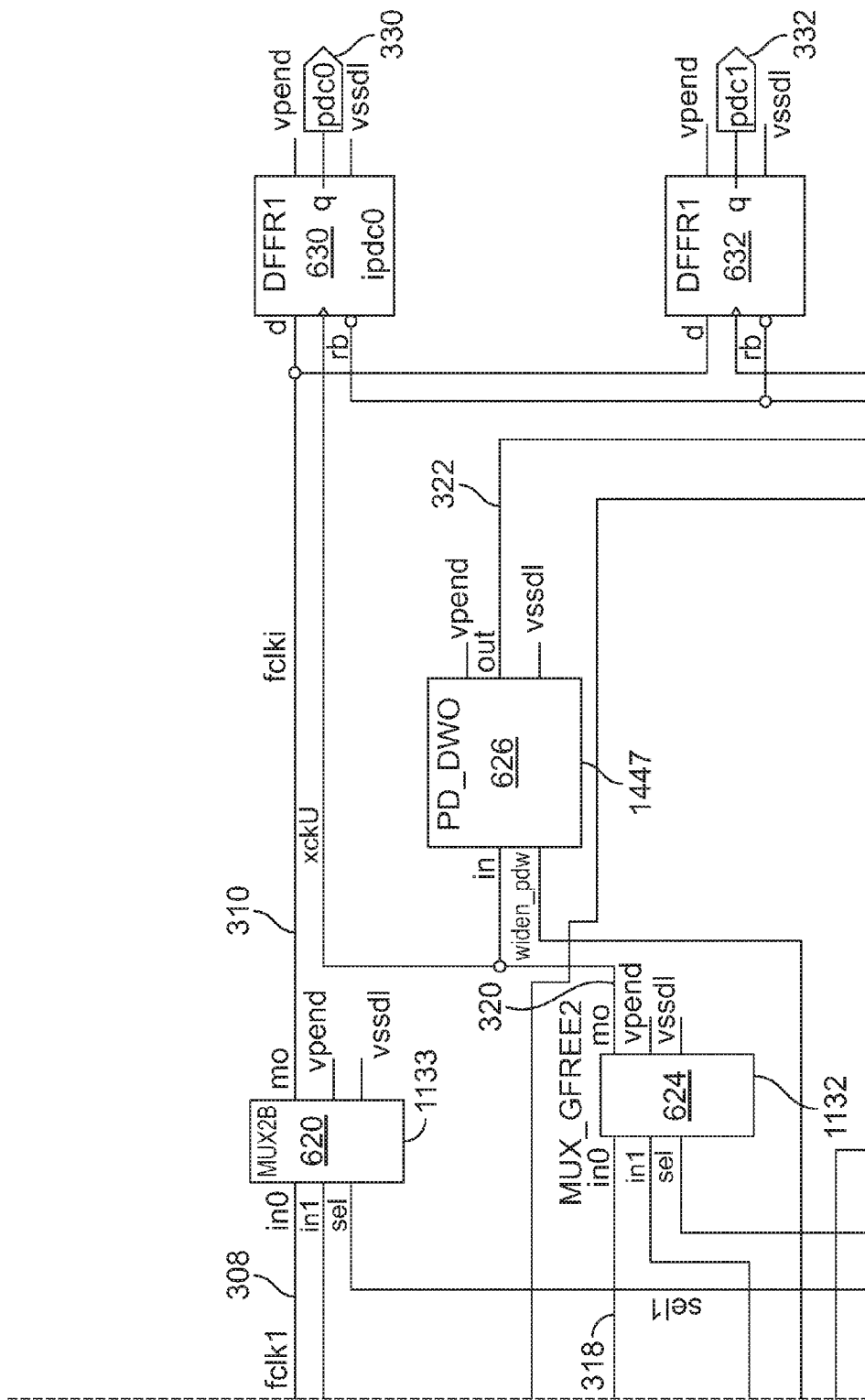
Figure 8C:
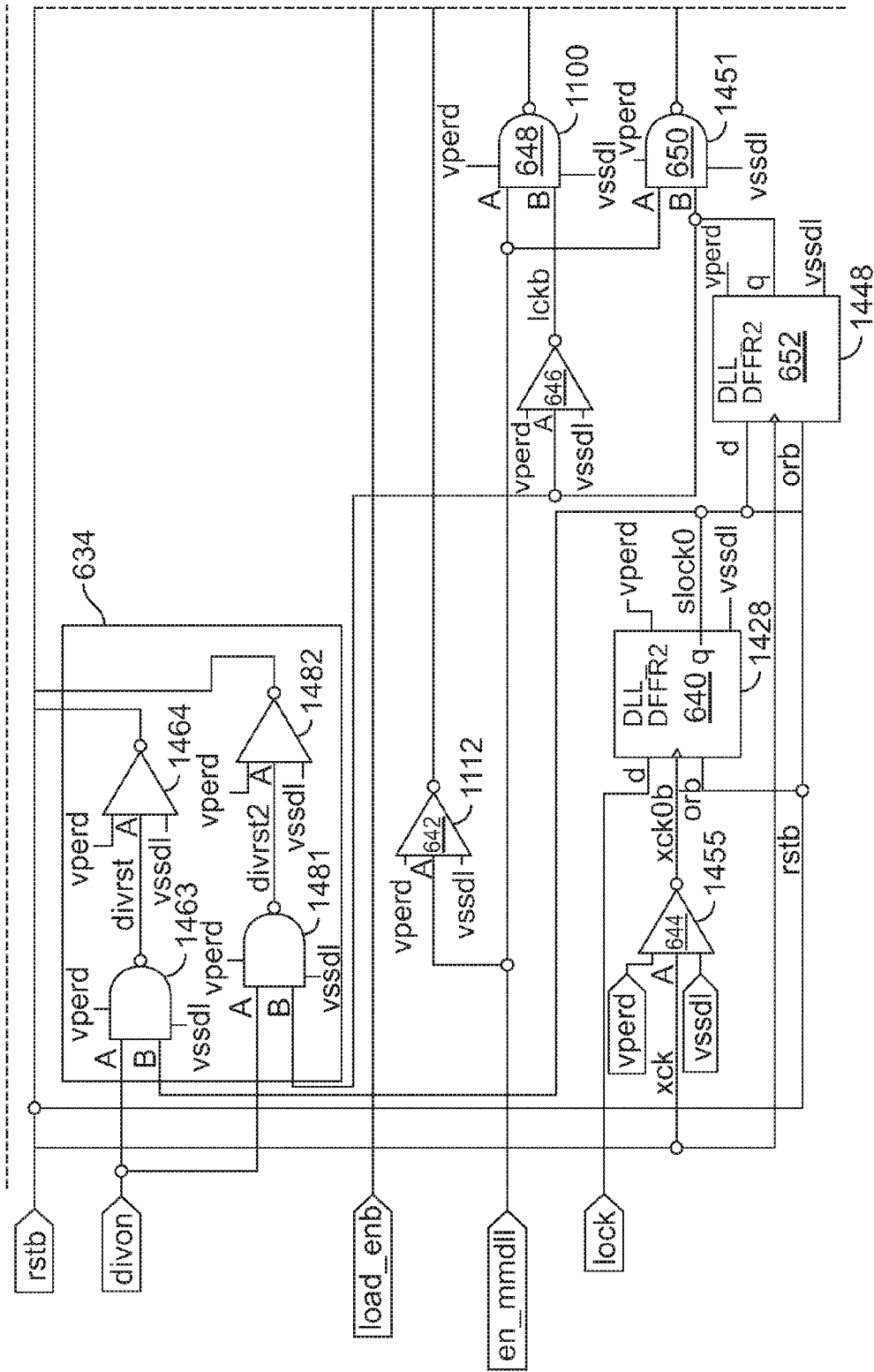
Figure 8D:
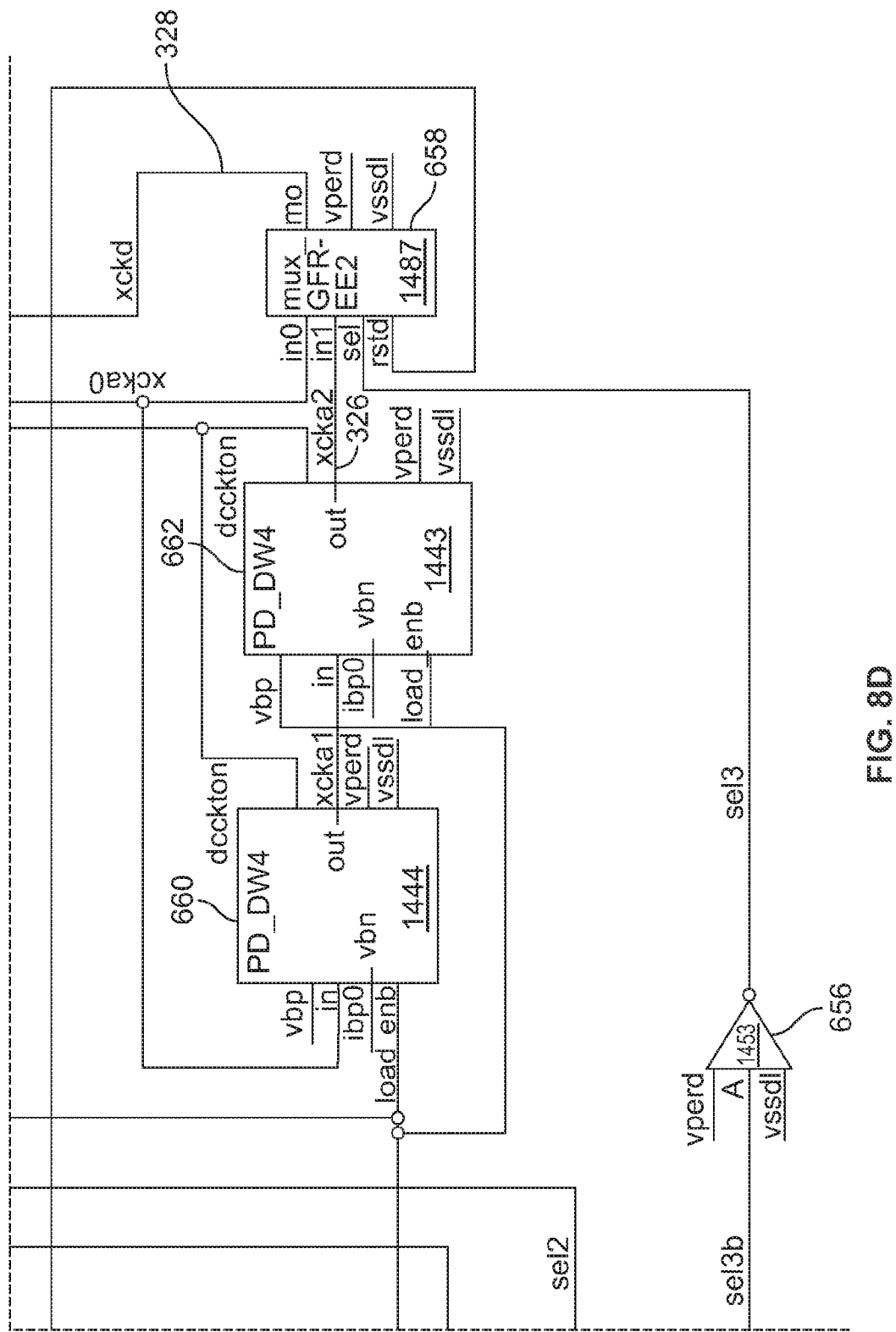

FIG. 7 illustrates a series of illustrative, interrelated waveforms of some exemplary digital phase detector circuits consistent with certain aspects related to the innovations herein. There are 17 waveforms of an exemplary digital phase detector, as shown in FIG. 7. The first waveform is the lock signal 334 (i.e., lock), which controls the DPD operation. The second waveform (i.e. fdbk_clk) is the feedback clock 302 from the digital delay line of the DLL. The third waveform (i.e. fclk0) is the input divided-by-N signal 304, where N may be set equal to 2 in one exemplary implementation. The fourth waveform is the fclk1 signal 306, which is the multiplexed ("mux") output of fclk0 and fdbk_clk controlled by the lock signal. The fifth waveform 308 (i.e. fclk2) is the delay version of fck1. The sixth waveform 310 is the fclk3 signal. It is the mux output from the fck2 signal permanently-controlled by a pre-wired logic_zero. The seventh waveform 312 (i.e. ref_clk) is the input reference clock, to which the DLL will lock. The eighth waveform 314 (i.e. rclk0) is the input divided-by-N signal, where again N may be set equal to 2 as an example. The ninth waveform 316 (i.e. rclk1) is the mux output of rclk0 and ref_clk controlled by the lock signal. The tenth waveform 318 (i.e. rclk2) is the delay version of rck1. The eleventh waveform 320 (i.e. rclk3) is the mux output of rclk1 and rclk2 controlled by the lock signal. Here, for example, the rising edge of rclk3 may be used to sample the fclk3 signal with the first flip flop 43 to output the 16th waveform 330 (i.e. pd0). The 12th waveform 322 (i.e. rclk4) is a delay version of rclk3. The 13th waveform 324 (i.e. rclk5) is a delay version of rclk4, while the 14th waveform 326 (i.e. rclk6) is a delay version of rclk5. The 15$^{th}$ waveform 328 (i.e. rclk7) is the mux output of rclk4 and rclk6. The rising edge of rclk7 will sample the fclk3 signal with the second flip-flop 44 to output the 17$^{th}$ waveform 332 (i.e. pd1). As such, in this exemplary implementation, when pd0 is equal to logic_0 and pd1 is equal to logic_1, the DLL is configured to achieve the phase-locking condition and the lock signal will change from logic_0 to logic_1. Accordingly, again, the difference between the consecutive rising edges of rclk3 and rclk7 forms the delta-timing windows. When the DLL is unlocked, the delta-timing window will be set to be small. But, when the DLL reaches the lock state, the delta-timing window will become large for the benefits set forth elsewhere herein.

FIGS. 8A-8D illustrate a block diagram of an exemplary digital phase detector circuit consistent with certain aspects related to the present invention. Referring first to the figures, the exemplary circuit may comprise two divide-by-N clock dividers 602, 604, several multiplexers 610, 612, 620, 624, 658, a variety of delay circuits 616, 618, 626, 660, 662, flip-flops 630, 632, as well as lock detection circuitry (not shown) and other circuits. The two main clock inputs of the exemplary digital phase detector, shown here, are a feedback clock 302 (fclk) and a reference clock 312 (xclk). In this exemplary implementation, the feedback clock 302 (fclk) is the feedback clock from the digital delay line of the delay-lock-loop circuitry. Referring to FIG. 5, both the feedback clock signal 302 and the reference clock signal 312 are input to respective divide-by-N clock dividers 602, 604. In one exemplary implementation, the dividers 602, 604 may be divide-by-2 dividers (e.g., N=2), as set forth and explained in more detail in connection with FIG. 6. The feedback clock signal 302 may be fed into a divide-by-N clock divider 602, with the output 304 (fclk0) of the divide-by-N clock divider 602 and its respective original clock signal 302 being provided as an input to a first multiplexer 610. (The reference clock signal 312 may be similarly fed into a divide-by-N clock divider 604 and second multiplexer 612, as set forth in more detail below.) The multiplexed feedback signal 306 (fclk1) is then provided as input both to a delay circuit 616 as well as to a third multiplexer 620, with the delayed version of the multiplexed feedback signal 308 (fclk2) being provided as the other input of the multiplexer 620. This third multiplexer output 310 (fclk3) is then provided as input to a first flip-flop 630, which also receives a similarly transformed signal 320 (rclk3) from a fourth multiplexer 624 as a second input. The first flip flop output signal is then provided as a first input of the lock detection circuitry, first lock input 330 (pd0), with the second lock input 332 (pd1) thereof being derived via reference clock processing circuitry.

With regard to the reference clock processing circuitry, the reference clock signal 312 may similarly be fed into a divide-by-N clock divider 604, with the output 314 (rclk0) of the divide-by-N clock divider 604 and its respective original reference clock signal 312 being provided as an input to the second multiplexer 612. The multiplexed reference signal 316 (rclk1) is then provided as input both to a delay circuit 618 as well as to a fourth multiplexer 624, with the delayed version of the multiplexed reference signal 318 (rclk2) being provided as the other input of the fourth multiplexer 624. This fourth multiplexer output 320 (rclk3) is then provided as a second input to the first flip-flop 630, as indicated above. Additionally, a delayed fourth multiplexer output signal 322 (rclk4) is provided via a third delay circuit 626 and provided as input to a fifth multiplexer 658. The delayed fourth multiplexer signal 322 is also fed through one or more stages of additional delay circuitry 660, 662 to provide a second signal 326 (rclk6) for input to the fifth multiplexer 658. The multiplexed output signal 328 (rclk7) of the fifth multiplexer 658 is then provided as an input to a second flip-flop 632 paired with the first flip-flop 630. The third multiplexer output 310 (fclk3) is provided as the other input to the second flip-flop 632, and the output of the second flip-flop 332 (pd1) is provided as the second input to the lock detect circuitry.

Additionally, the innovations herein may be achieved via implementations with differing or entirely different components, beyond the specific circuitry set forth above. With regard to such other components (e.g., circuitry, computing/processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to, various clock-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may occur from both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe components such as software, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques. Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the appended claims and the applicable rules of law.

The invention claimed is:

1. A system including circuitry that controls clock signals, the circuitry comprising:
    digital phase detection circuitry that uses a phase detect window to detect an input signal phase of a first clock and an output signal phase of a second clock;
    digital delay control circuitry configured to, via a first adjustment mode, adjust a delay channel until the output signal phase is within a first phase detection window of the input signal phase;
    analog phase detection circuitry that detects the input signal phase and the output signal phase; and
    analog delay control circuitry configured to, via a second adjustment mode, adjust the delay channel until the output signal phase is equal to the input signal phase, in response to which the circuitry transitions from an unlocked state to a locked state;
    wherein the circuitry has a configuration that prevents transition back to the unlocked state due to jitter or noise;
    wherein the first phase detection window has a duration of between about 50 to about 900 picoseconds.

2. The system of claim 1 wherein the first phase detection window has a width established as a function of a frequency of the input signal, of a magnitude on scale with between about 100 to about 200 picoseconds for an input signal in a frequency range of about 100 MHz to about 2 GHz.

3. The system of claim 1 wherein the configuration includes circuitry that, in analog adjustment mode and during lock, maintains a widened phase detect window to reduce unwanted transition back to the unlocked state caused by spurious effects on the circuitry.

4. The system of claim 1 wherein the second/analog adjustment mode, including utilization of the widened phase detection window, is continued after the locked state is reached to maintain the locked state.

5. The system of claim 1 further comprising:
    first circuitry through which the reference clock signal passes including at least one multiplexer and one or more delay components;
    second circuitry through which the feedback clock signal passes including at least one multiplexer and one or more a delay components.

6. The system of claim 1 wherein the digital phase detection window is adjusted via one or more multiplexer elements in a feedback clock line, which multiplex the feedback clock line signal to add delay.

7. The system of claim 1 wherein the digital phase detection window is adjusted via one or more multiplexer elements in a reference clock line, which multiplex the reference clock line signal to add delay.

8. A system including circuitry that controls clock signals, the circuitry comprising:
digital phase detection circuitry that uses a phase detect window to detect an input signal phase of a first clock and an output signal phase of a second clock;
digital delay control circuitry configured to, via a first adjustment mode, adjust a delay channel until the output signal phase is within a first phase detection window of the input signal phase;
analog phase detection circuitry that detects the input signal phase and the output signal phase; and
analog delay control circuitry configured to, via a second adjustment mode, adjust the delay channel until the output signal phase is equal to the input signal phase, in response to which the circuitry transitions from an unlocked state to a locked state;
wherein the circuitry has a configuration that prevents transition back to the unlocked state due to jitter or noise;
wherein the configuration includes circuitry that, in the second adjustment mode and during lock, maintains a widened phase detect window to reduce unwanted transition back to the unlocked state caused by spurious effects on the circuitry.

9. The system of claim 8 wherein the second/analog adjustment mode, including utilization of the widened phase detection window, is continued after the locked state is reached to maintain the locked state.

10. The system of claim 8 further comprising:
first circuitry through which the reference clock signal passes including at least one multiplexer and one or more delay components;
second circuitry through which the feedback clock signal passes including at least one multiplexer and one or more a delay components.

11. The system of claim 8 wherein the digital phase detection window is adjusted via one or more multiplexer elements in a feedback clock line, which multiplex the feedback clock line signal to add delay.

12. The system of claim 8 wherein the digital phase detection window is adjusted via one or more multiplexer elements in a reference clock line, which multiplex the reference clock line signal to add delay.

13. A system including circuitry that controls clock signals, the circuitry comprising:
digital phase detection circuitry that uses a phase detect window to detect an input signal phase of a first clock and an output signal phase of a second clock;
digital delay control circuitry configured to, via a first adjustment mode, adjust a delay channel until the output signal phase is within a first phase detection window of the input signal phase;
analog phase detection circuitry that detects the input signal phase and the output signal phase; and
analog delay control circuitry configured to, via a second adjustment mode, adjust the delay channel until the output signal phase is equal to the input signal phase, in response to which the circuitry transitions from an unlocked state to a locked state;
wherein the circuitry has a configuration that prevents transition back to the unlocked state due to jitter or noise;
wherein a clock rate of the digital phase detection circuitry is reduced.

14. The system of claim 13 wherein the configuration includes circuitry that, in analog adjustment mode and during lock, maintains a widened phase detect window to reduce unwanted transition back to the unlocked state caused by spurious effects on the circuitry.

15. The system of claim 13 wherein the second/analog adjustment mode, including utilization of the widened phase detection window, is continued after the locked state is reached to maintain the locked state.

16. The system of claim 13 further comprising:
first circuitry through which the reference clock signal passes including at least one multiplexer and one or more delay components;
second circuitry through which the feedback clock signal passes including at least one multiplexer and one or more a delay components.

17. The system of claim 13 wherein the digital phase detection window is adjusted via one or more multiplexer elements in a feedback clock line, which multiplex the feedback clock line signal to add delay.

18. The system of claim 13 wherein the digital phase detection window is adjusted via one or more multiplexer elements in a reference clock line, which multiplex the reference clock line signal to add delay.

19. A system including circuitry that controls clock signals, the circuitry comprising:
digital phase detection circuitry that uses a phase detect window to detect an input signal phase of a first clock and an output signal phase of a second clock;
digital delay control circuitry configured to, via a first adjustment mode, adjust a delay channel until the output signal phase is within a first phase detection window of the input signal phase;
analog phase detection circuitry that detects the input signal phase and the output signal phase; and
analog delay control circuitry configured to, via a second adjustment mode, adjust the delay channel until the output signal phase is equal to the input signal phase, in response to which the circuitry transitions from an unlocked state to a locked state;
wherein the circuitry has a configuration that prevents transition back to the unlocked state due to jitter or noise;
wherein a clock rate is reduced during the second adjustment mode and the locked mode to insulate the analog phase detection circuitry from jitter or noise.

20. The system of claim 19 wherein the rate/frequency is decreased via introduction of divide-by-N circuitry.

21. A system including circuitry that controls clock signals, the circuitry comprising:
digital phase detection circuitry that uses a phase detect window to detect an input signal phase of a first clock and an output signal phase of a second clock;
digital delay control circuitry configured to, via a first adjustment mode, adjust a delay channel until the output signal phase is within a first phase detection window of the input signal phase;
analog phase detection circuitry that detects the input signal phase and the output signal phase; and
analog delay control circuitry configured to, via a second adjustment mode, adjust the delay channel until the output signal phase is equal to the input signal phase, in response to which the circuitry transitions from an unlocked state to a locked state;
wherein the circuitry has a configuration that prevents transition back to the unlocked state due to jitter or noise;
wherein the digital phase detection window is widened by one or both of:
shifting the leading edge of the detection window earlier; and/or
shifting the trailing edge of the detection window later.

22. The system of claim 21 wherein the leading edge of the detection window is shifted earlier via reducing or eliminating delay.

23. The system of claim 22 wherein the reducing or eliminating delay includes removing/bypassing a circuit that provides delay.

24. The system of claim 21 wherein the trailing edge of the detection window is shifted later via introduction of delay or multiplexing circuitry.

25. The system of claim 24 wherein the delay is introduced by adding an extra delay circuit via multiplexing the signal.

26. A system including circuitry that controls clock signals, the circuitry comprising:
    digital phase detection circuitry that uses a phase detect window to detect an input signal phase of a first clock and an output signal phase of a second clock;
    digital delay control circuitry configured to, via a first adjustment mode, adjust a delay channel until the output signal phase is within a first phase detection window of the input signal phase;
    analog phase detection circuitry that detects the input signal phase and the output signal phase; and
    analog delay control circuitry configured to, via a second adjustment mode, adjust the delay channel until the output signal phase is equal to the input signal phase, in response to which the circuitry transitions from an unlocked state to a locked state;
    wherein the circuitry has a configuration that prevents transition back to the unlocked state due to jitter or noise;
    wherein the second adjustment mode, including utilization of a widened phase detection window, is continued after the locked state is reached to maintain the locked state.

27. The system of claim 26 further comprising:
    first circuitry through which the reference clock signal passes including at least one multiplexer and one or more delay components;
    second circuitry through which the feedback clock signal passes including at least one multiplexer and one or more a delay components.

28. The system of claim 26 wherein the digital phase detection window is adjusted via one or more multiplexer elements in a feedback clock line, which multiplex the feedback clock line signal to add delay.

29. The system of claim 26 wherein the digital phase detection window is adjusted via one or more multiplexer elements in a reference clock line, which multiplex the reference clock line signal to add delay.

30. The system of claim 26 further comprising a divide-by-N circuit or a divide-by-2 circuit in the feedback clock line, through which the feedback clock is fed during an adjustment mode to widen the phase detect window.

31. The system of claim 26 further comprising a divide-by-N circuit or a divide-by-2 circuit in the reference clock line, through which the reference clock is fed during an adjustment mode to widen the phase detect window.

32. The system of claim 26 wherein the delay channel includes an analog-controlled delay component and a digital-controlled delay component.

33. The system of claim 26 wherein circuitry provides a lock confirmation signal when the output signal phase is within an accurate/fine window of the input signal phase.

34. The system of claim 26 further comprising a lock detect component that determines whether or not the output signal phase is equal to the input signal phase and provides an output confirming that the output clock is locked to the input clock.

35. A system including circuitry that controls clock signals, the circuitry comprising:
    digital phase detection circuitry that uses a phase detect window to detect an input signal phase of a first clock and an output signal phase of a second clock;
    digital delay control circuitry configured to, via a first adjustment mode, adjust a delay channel until the output signal phase is within a first phase detection window of the input signal phase;
    analog phase detection circuitry that detects the input signal phase and the output signal phase;
    analog delay control circuitry configured to, via a second adjustment mode, adjust the delay channel until the output signal phase is equal to the input signal phase, in response to which the circuitry transitions from an unlocked state to a locked state;
    first circuitry through which a reference clock signal passes including at least one multiplexer and one or more delay components; and
    second circuitry through which a feedback clock signal passes including at least one multiplexer and one or more a delay component(s);
    wherein the circuitry has a configuration that prevents transition back to the unlocked state due to jitter or noise.

36. The system of claim 35 wherein the digital phase detection window is adjusted via one or more multiplexer elements in a feedback clock line, which multiplex the feedback clock line signal to add delay.

37. The system of claim 35 wherein the digital phase detection window is adjusted via one or more multiplexer elements in a reference clock line, which multiplex the reference clock line signal to add delay.

38. The system of claim 35 wherein one or more delay components in the second circuitry are utilized to provide delay in the delay channel during the first adjustment mode and then bypassed in the second adjustment mode to widen the phase detect window during the second/analog adjustment mode.

39. The system of claim 38 further comprising one or more frequency reduction components in the feedback clock line and/or the reference clock line.

40. The system of claim 39 wherein the frequency reduction component comprises a divide-by-N circuit or a divide-by-2 circuit, through which the reference clock is fed during the second adjustment mode to widen the phase detect window.

41. A system including circuitry that controls clock signals, the circuitry comprising:
    digital phase detection circuitry that uses a phase detect window to detect an input signal phase of a first clock and an output signal phase of a second clock;
    digital delay control circuitry configured to, via a first adjustment mode, adjust a delay channel until the output signal phase is within a first phase detection window of the input signal phase;
    analog phase detection circuitry that detects the input signal phase and the output signal phase; and
    analog delay control circuitry configured to, via a second adjustment mode, adjust the delay channel until the output signal phase is equal to the input signal phase, in response to which the circuitry transitions from an unlocked state to a locked state;
    wherein the circuitry has a configuration that prevents transition back to the unlocked state due to jitter or noise;

wherein the digital phase detection window is adjusted via one or more multiplexer elements in a feedback clock line, which multiplex the feedback clock line signal to add delay.

42. The system of claim 41 wherein the digital phase detection window is adjusted via one or more multiplexer elements in a reference clock line, which multiplex the reference clock line signal to add delay.

43. The system of claim 41 further comprising a divide-by-N circuit or a divide-by-2 circuit in the feedback clock line, through which the feedback clock is fed during an adjustment mode to widen the phase detect window.

44. The system of claim 41 further comprising a divide-by-N circuit or a divide-by-2 circuit in the reference clock line, through which the reference clock is fed during an adjustment mode to widen the phase detect window.

45. The system of claim 41 wherein the delay channel includes an analog-controlled delay component and a digital-controlled delay component.

46. The system of claim 41 wherein circuitry provides a lock confirmation signal when the output signal phase is within an accurate/fine window of the input signal phase.

47. The system of claim 41 further comprising a lock detect component that determines whether or not the output signal phase is equal to the input signal phase and provides an output confirming that the output clock is locked to the input clock.

48. A system including circuitry that controls clock signals, the circuitry comprising:
 digital phase detection circuitry that uses a phase detect window to detect an input signal phase of a first clock and an output signal phase of a second clock;
 digital delay control circuitry configured to, via a first adjustment mode, adjust a delay channel until the output signal phase is within a first phase detection window of the input signal phase;
 analog phase detection circuitry that detects the input signal phase and the output signal phase; and
 analog delay control circuitry configured to, via a second adjustment mode, adjust the delay channel until the output signal phase is equal to the input signal phase, in response to which the circuitry transitions from an unlocked state to a locked state;
 wherein the circuitry has a configuration that prevents transition back to the unlocked state due to jitter or noise;
 wherein the digital phase detection window is adjusted via one or more multiplexer elements in a reference clock line, which multiplex the reference clock line signal to add delay.

49. The system of claim 48 wherein the delay channel includes an analog-controlled delay component and a digital-controlled delay component.

50. The system of claim 48 wherein circuitry provides a lock confirmation signal when the output signal phase is within an accurate/fine window of the input signal phase.

51. The system of claim 48 further comprising a lock detect component that determines whether or not the output signal phase is equal to the input signal phase and provides an output confirming that the output clock is locked to the input clock.

52. The system of claim 48 further comprising a divide-by-N circuit or a divide-by-2 circuit in the feedback clock line, through which the feedback clock is fed during an adjustment mode to widen the phase detect window.

53. The system of claim 48 further comprising a divide-by-N circuit or a divide-by-2 circuit in the reference clock line, through which the reference clock is fed during an adjustment mode to widen the phase detect window.

54. The system of claim 48 wherein the delay channel includes an analog-controlled delay component and a digital-controlled delay component.

55. The system of claim 48 wherein circuitry provides a lock confirmation signal when the output signal phase is within an accurate/fine window of the input signal phase.

56. The system of claim 48 further comprising a lock detect component that determines whether or not the output signal phase is equal to the input signal phase and provides an output confirming that the output clock is locked to the input clock.

57. A system including circuitry that controls clock signals, the circuitry comprising:
 digital phase detection circuitry that uses a phase detect window to detect an input signal phase of a first clock and an output signal phase of a second clock;
 digital delay control circuitry configured to, via a first adjustment mode, adjust a delay channel until the output signal phase is within a first phase detection window of the input signal phase;
 analog phase detection circuitry that detects the input signal phase and the output signal phase;
 analog delay control circuitry configured to, via a second adjustment mode, adjust the delay channel until the output signal phase is equal to the input signal phase, in response to which the circuitry transitions from an unlocked state to a locked state; and
 a divide-by-N circuit in a feedback clock line, through which the feedback clock is fed during an adjustment mode to widen the phase detect window;
 wherein the circuitry has a configuration that prevents transition back to the unlocked state due to jitter or noise.

58. The system of claim 57 further comprising a divide-by-N circuit or a divide-by-2 circuit in the reference clock line, through which the reference clock is fed during an adjustment mode to widen the phase detect window.

59. The system of claim 57 wherein the delay channel includes an analog-controlled delay component and a digital-controlled delay component.

60. A system including circuitry that controls clock signals, the circuitry comprising:
 digital phase detection circuitry that uses a phase detect window to detect an input signal phase of a first clock and an output signal phase of a second clock;
 digital delay control circuitry configured to, via a first adjustment mode, adjust a delay channel until the output signal phase is within a first phase detection window of the input signal phase;
 analog phase detection circuitry that detects the input signal phase and the output signal phase;
 analog delay control circuitry configured to, via a second adjustment mode, adjust the delay channel until the output signal phase is equal to the input signal phase, in response to which the circuitry transitions from an unlocked state to a locked state; and
 a divide-by-N circuit in a reference clock line, through which the reference clock is fed during an adjustment mode to widen the phase detect window;
 wherein the circuitry has a configuration that prevents transition back to the unlocked state due to jitter or noise.

61. The system of claim 60 wherein the delay channel includes an analog-controlled delay component and a digital-controlled delay component.

62. A system including circuitry that controls clock signals, the circuitry comprising:
 digital phase detection circuitry that uses a phase detect window to detect an input signal phase of a first clock and an output signal phase of a second clock;

digital delay control circuitry configured to, via a first adjustment mode, adjust a delay channel until the output signal phase is within a first phase detection window of the input signal phase;

analog phase detection circuitry that detects the input signal phase and the output signal phase; and analog delay control circuitry configured to, via a second adjustment mode, adjust the delay channel until the output signal phase is equal to the input signal phase, in response to which the circuitry transitions from an unlocked state to a locked state;

wherein the circuitry has a configuration that prevents transition back to the unlocked state due to jitter or noise;

wherein circuitry provides a lock confirmation signal when the output signal phase is within an accurate/fine window of the input signal phase;

wherein the circuitry includes a pair of flip-flops and a lock detect state machine that provide the lock confirmation signal.

63. A system including circuitry that controls clock signals, the circuitry comprising:

digital phase detection circuitry that uses a phase detect window to detect an input signal phase of a first clock and an output signal phase of a second clock;

digital delay control circuitry configured to, via a first adjustment mode, adjust a delay channel until the output signal phase is within a first phase detection window of the input signal phase;

analog phase detection circuitry that detects the input signal phase and the output signal phase;

analog delay control circuitry configured to, via a second adjustment mode, adjust the delay channel until the output signal phase is equal to the input signal phase, in response to which the circuitry transitions from an unlocked state to a locked state; and a lock detect component that determines whether or not the output signal phase is equal to the input signal phase and provides an output confirming that the output clock is locked to the input clock;

wherein the circuitry has a configuration that prevents transition back to the unlocked state due to jitter or noise;

wherein the lock detect component is a lock detect state machine.

64. A method of controlling delay/lock circuitry via control of a phase detect window, the method comprising:

detecting an input signal phase of a reference clock and an output signal phase of a feedback clock;

adjusting, via a digital adjustment mode, the second clock until the output signal phase is approximately equal to the input signal phase;

when the output signal phase is approximately equal to the input signal phase, entering an analog adjustment mode; and adjusting the output signal until the output signal phase is equal to the input signal phase, whereupon the circuitry transitions from an unlocked state to a locked state;

wherein, in the digital adjustment mode, a digital phase detection window is adjusted via one or more multiplexer elements in a reference clock line, which multiplex the reference clock line signal to add delay.

65. A digital phase detector comprising:

delay lock loop circuitry comprising:

delay control circuitry including:

digital phase detection circuitry that uses a digital phase detect window to detect an input signal phase of a first clock and an output signal phase of a second clock;

digital delay control circuitry configured to, via a first adjustment mode, adjust the delay channel until the output signal phase is within a first phase detection window of the input signal phase;

analog phase detection circuitry that detects the input signal phase and the output signal phase; and analog delay control circuitry configured to, via a second adjustment mode, adjust the delay channel until the output signal phase is equal to the input signal phase, in response to which the circuitry is changed from an unlocked state to locked state;

wherein the circuitry has a configuration that prevents transition back to the unlocked state due to jitter or noise;

wherein the digital phase detection window is adjusted via one or more multiplexer elements in a feedback clock line, which multiplex the feedback clock line signal to add delay.

* * * * *